United States Patent
Kwak et al.

(10) Patent No.: US 7,366,822 B2
(45) Date of Patent: Apr. 29, 2008

(54) SEMICONDUCTOR MEMORY DEVICE CAPABLE OF READING AND WRITING DATA AT THE SAME TIME

(75) Inventors: Jin-Seok Kwak, Suwon-si (KR);
Young-Hyun Jun, Seoul (KR);
Seong-Jin Jang, Seongnam-si (KR);
Sang-Bo Lee, Yongin-si (KR);
Min-Sang Park, Yongin-si (KR);
Chul-Soo Kim, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 333 days.

(21) Appl. No.: 10/840,268

(22) Filed: May 7, 2004

(65) Prior Publication Data
US 2004/0252577 A1 Dec. 16, 2004

Related U.S. Application Data

(63) Continuation-in-part of application No. 10/298,553, filed on Nov. 19, 2002, now Pat. No. 7,203,810.

(30) Foreign Application Priority Data
Nov. 26, 2001 (KR) .......................... 2001-0073737
Oct. 2, 2003 (KR) ..................... 10-2003-0068878

(51) Int. Cl.
*G06F 12/00* (2006.01)
*G11C 8/00* (2006.01)

(52) U.S. Cl. .......................... 711/5; 711/167; 711/150; 365/230.06

(58) Field of Classification Search .................... 711/5, 711/167; 365/230.06, 231
See application file for complete search history.

(56) References Cited

U.S. PATENT DOCUMENTS 5,109,857 A * 5/1992 Roundhill et al. .......... 600/437
5,463,590 A * 10/1995 Watanabe ............... 365/230.03

(Continued)

FOREIGN PATENT DOCUMENTS

JP 10-031886 2/1998

(Continued)

OTHER PUBLICATIONS

Korean Patent Office Communication dated Jun. 29, 2005, for Korean Patent Application No. 10-2003-0068878, with English Translation.

*Primary Examiner*—Matthew Kim
*Assistant Examiner*—Michael Krofcheck
(74) *Attorney, Agent, or Firm*—Harness, Dickey & Pierce, P.L.C.

(57) ABSTRACT

A semiconductor memory device includes a plurality of banks. A data path may be divided into a read data path and a write data path, therefore, parallel processing of write and read commands are possible. The semiconductor memory device may include an address bank buffer, address buffer, column predecoder and/or a decoder. The semiconductor memory device may begin execution of a write command in a bank in one clock cycle and begin execution of a read command in the following clock cycle, therefore, bus efficiency is increased and/or write-to-read turn around time is reduced.

13 Claims, 6 Drawing Sheets

U.S. PATENT DOCUMENTS

| | | | |
|---|---|---|---|
| 5,774,409 A * | 6/1998 | Yamazaki et al. | 365/230.03 |
| 5,864,505 A * | 1/1999 | Higuchi | 365/189.04 |
| 6,005,823 A * | 12/1999 | Martin et al. | 365/230.08 |
| 6,044,429 A * | 3/2000 | Ryan et al. | 710/305 |
| 6,246,614 B1 * | 6/2001 | Ooishi | 365/191 |
| 6,279,090 B1 * | 8/2001 | Manning | 711/167 |
| 2002/0196669 A1 | 12/2002 | Hsu et al. | |

FOREIGN PATENT DOCUMENTS

| | | |
|---|---|---|
| KR | 1998-056135 | 9/1998 |
| KR | 10-2001-0057380 | 7/2001 |
| KR | 10-2003-0056344 | 7/2003 |

* cited by examiner

SEMICONDUCTOR MEMORY DEVICE CAPABLE OF READING AND WRITING DATA AT THE SAME TIME

CROSS-REFERENCE TO RELATED APPLICATIONS

This application is a continuation-in-part of U.S. Ser. No. 10/298,553 filed on Nov. 19, 2002 now U.S. Pat. No. 7,203,810, which claims the benefit under 35 U.S.C. § 119(a) of Korean Patent Application No. 2001-0073737, filed on Nov. 26, 2001, and this application claims the benefit under 35 U.S.C. § 119(a) of Korean Patent Application No. 2003-0068878, filed on Oct. 2, 2003, the contents of all of which are hereby incorporated by reference in their entirety.

FIELD OF THE INVENTION

The present invention relates to a semiconductor memory device and, more particularly, to a memory device having a plurality of memory banks.

BACKGROUND OF THE INVENTION

Dynamic random access memories (DRAMs) are lower in cost than static random access memories (SRAMs). Therefore, DRAMs are often used in personal computers (PC) and large-scale computers.

In a DRAM, an interval between a write command and a read command may be a significant factor and may be called a write-to-read turn around time. The write-to-read turn around time may be an important parameter in a write operation and may have an effect on bus efficiency.

FIG. 1 shows a conventional timing diagram when write and read commands of a conventional DRAM are successive.

An exemplary write latency of a double data rate (DDR) synchronous DRAM (SDRAM) is 10 clock cycles. The write latency may be defined as the delay time between a write command and its finished execution. In one example, a write command of a bank begins execution and two data (DDR) are inputted in the next clock.

Conventionally, a DDR SDRAM uses a 2-bit prefetch scheme. Thus, the DDR SDRAM performs a write operation after receiving two serial input data and arranges the data in parallel.

A column selection signal (CSL) for writing data to a bitline sense amplifier (BL S/A) and a cell may be generated in a second clock cycle to write the data to the memory bank. The CSL signal generated in the second clock may be disabled in a third clock cycle in which a precharge operation for an internal data bus is performed. The internal data bus, which receives a previous write command to transition from a high level to a low level, may be precharged during a clock cycle.

Since the internal bus is shared between different banks, it may be precharged before a read command of a different bank can be executed. Therefore, the read command of the different bank may be applied in a fourth clock cycle after a write command is applied. In FIG. 1, a CAS latency of the read is exemplarily set to "3".

As shown in FIG. 1, there is an interval of four cycles between write and read commands. Further, FIG. 1 shows an interval of five clock cycles between data transfers for read and write command executions. The shared data bus is inactive during these intervals between data transfers, and therefore inefficient. System applications incorporating frequent read-to-write commands are particularly inefficient.

SUMMARY OF THE INVENTION

Exemplary embodiments of the present invention provide a memory device which can apply a read command of a bank in the next clock cycle after applying a write command of another bank.

According to an exemplary embodiment, the present invention is directed to a semiconductor memory device comprising a bank address buffer for holding a bank address; an address buffer for holding a column address and a row address; a memory cell array having a plurality of banks to store data; and a decoder incorporated in the plurality of banks to decode an address.

According to another exemplary embodiment, the present invention is directed to a bank address buffer comprising a read column bank address latch for receiving a read signal and a bank address signal and for updating the bank address signal based on the read signal and a write column bank address latch for receiving a write signal and the bank address signal and for updating the bank address signal based on the write signal.

According to another exemplary embodiment, the present invention is directed to an address buffer comprising a row address latch for receiving an active signal and an address signal and for updating the address signal based on the active signal; a read column address latch for receiving a read signal and an address signal and for updating the address signal based on the read signal; and a write column address latch for receiving a write signal and an address signal and for updating the bank address signal based on the write signal.

According to another exemplary embodiment, the present invention is directed to a predecoder device for receiving at least one read column address signal and at least one write column address signal, the predecoder device comprising N (N≧1) bank predecoders, each for receiving a Nth read column bank address signal and an Nth write column bank address signal and outputting an address predecoding signal.

DETAILED DESCRIPTION OF EXEMPLARY EMBODIMENT OF THE INVENTION

Exemplary embodiments of the present invention will now be described in detail. In an exemplary embodiment, a semiconductor memory device may include a memory cell array having two or more banks.

Figure 1:
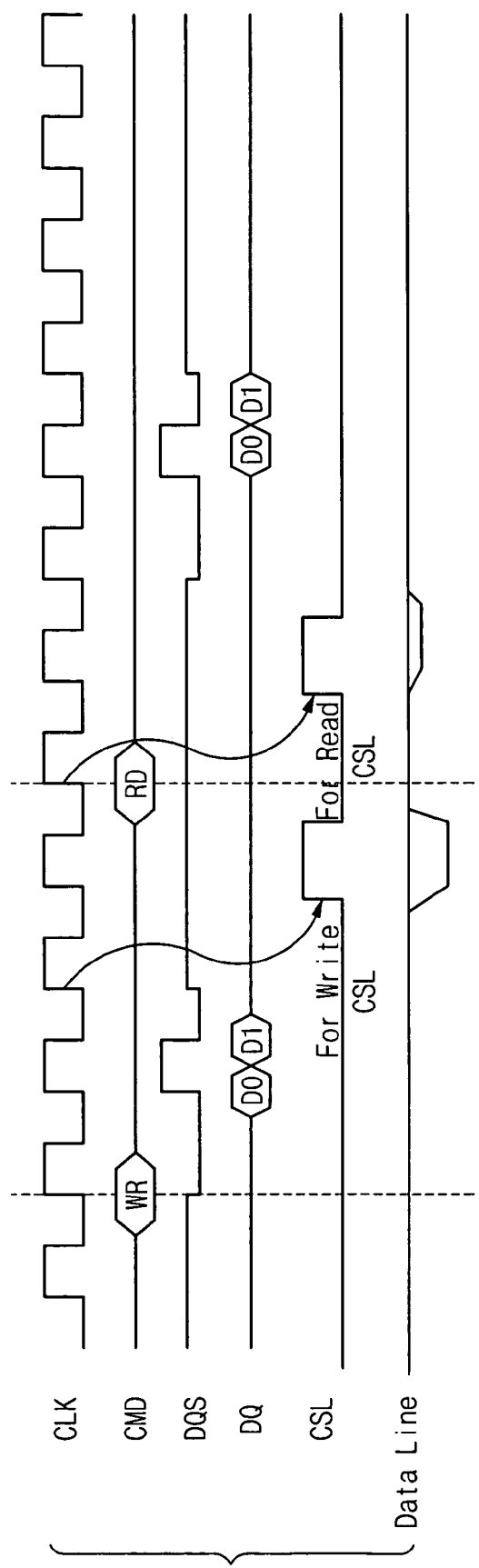
FIG. 1 is a conventional timing diagram when write and read commands of a typical DDR SDRAM are successive.
Figure 2:
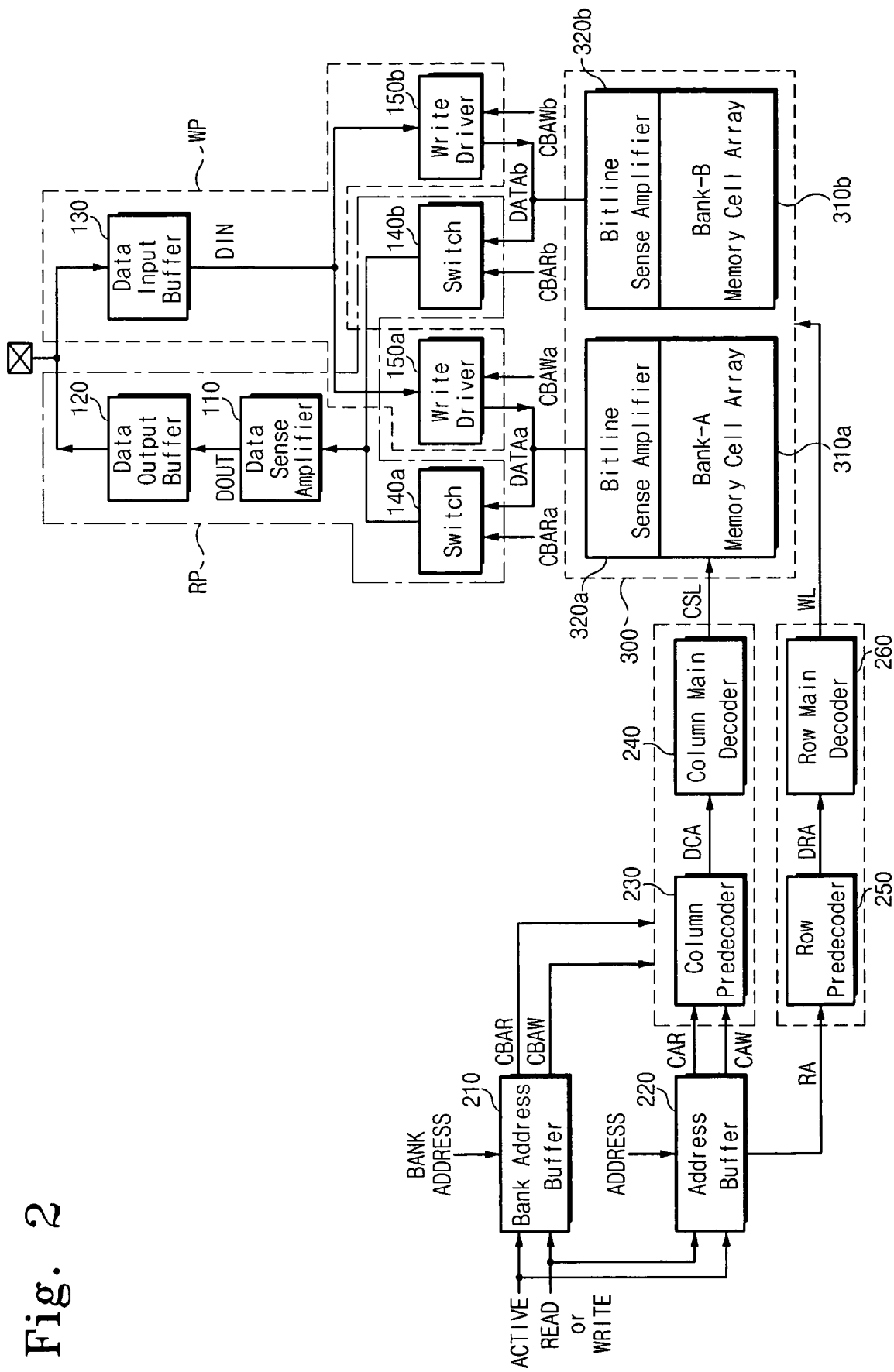
FIG. 2 is a block diagram showing the configuration of a semiconductor memory device which can read and write data at the same time according an exemplary embodiment of the present invention.

Referring to FIG. 2, an exemplary embodiment includes a bank address buffer 210, an address buffer 220, a column predecoder 230, a column main decoder 240, a row predecoder 250, a row main decoder 260, a memory cell array 300 having a plurality of banks, data lines DATAa and DATAb, a read data path RP, and a write data path WP.

The column predecoder 230, the column main decoder 240, the row predecoder 250, the row main decoder 260, and the data lines DATAa and DATAb are disposed in each bank.

The bank address buffer 210 stores a column bank address, and the address buffer 220 stores a column address and a row address.

The column predecoder 230 combines a read/write column address signal outputted from the bank address buffer 210 with a read/write column bank address signal outputted from the address buffer 220 to generate a column address predecoding signal (DCA). The column main decoder 240 generates a column selecting signal at each bank by means of the DCA generated at each bank.

The WP has write drivers 150a and 150b incorporated in each bank and a data input buffer 130 for holding data which will be stored in a bank through the input/output pin. The RP has switches 140a and 140b incorporated in each bank, a data sense amplifier 110, and a data output buffer 120 for storing a data signal amplified in the data sense amplifier 110. RP and WP are insulated from each other.

Figure 3:
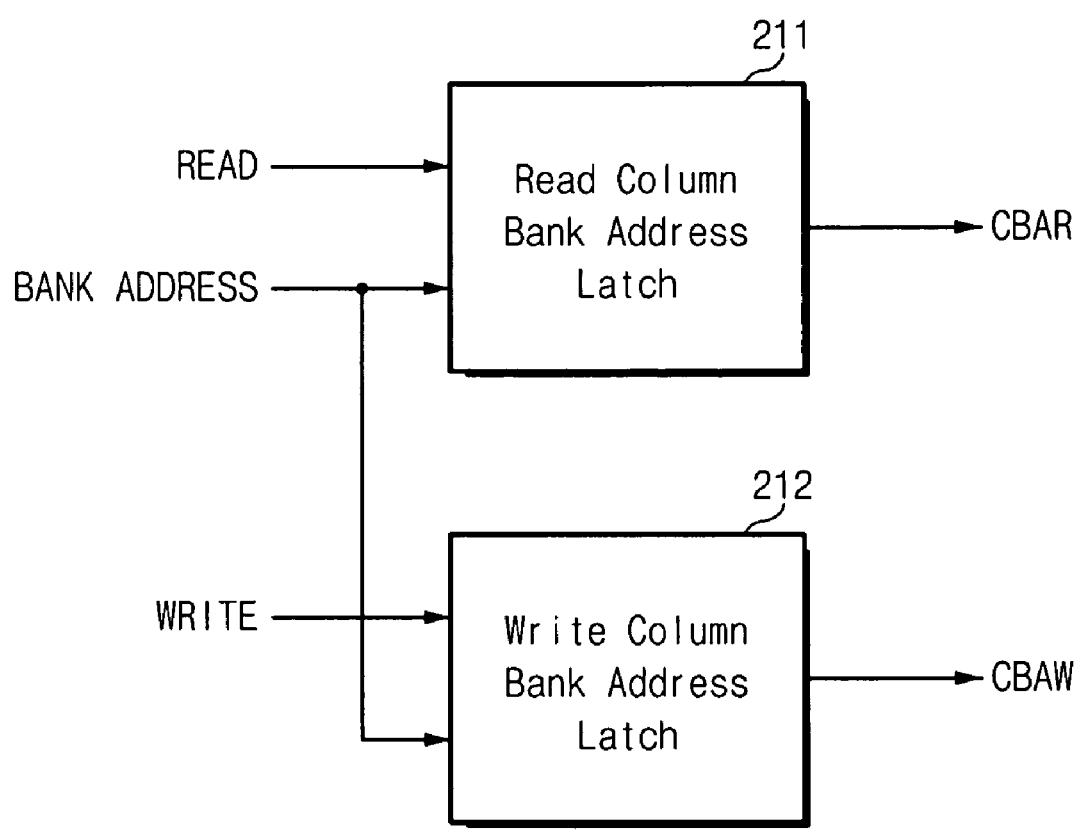
FIG. 3 is an exemplary diagram showing the configuration of a bank address buffer shown in FIG. 2.

An exemplary configuration of the bank address buffer 210 is shown in FIG. 3. Referring to FIG. 3, the bank address buffer 210 includes a read column bank address latch 211 and a write column address latch 212.

The read column bank address latch 211 stores a bank address and updates this address in response to a read signal READ. The column bank address latch 212 stores a bank address and updates this address in response to a write signal WRITE. The number of the read column bank address latches 211 may be equal to the number of the banks. Further, the number of the write column bank address latches 212 may be equal to the number of the banks.

Figure 4:
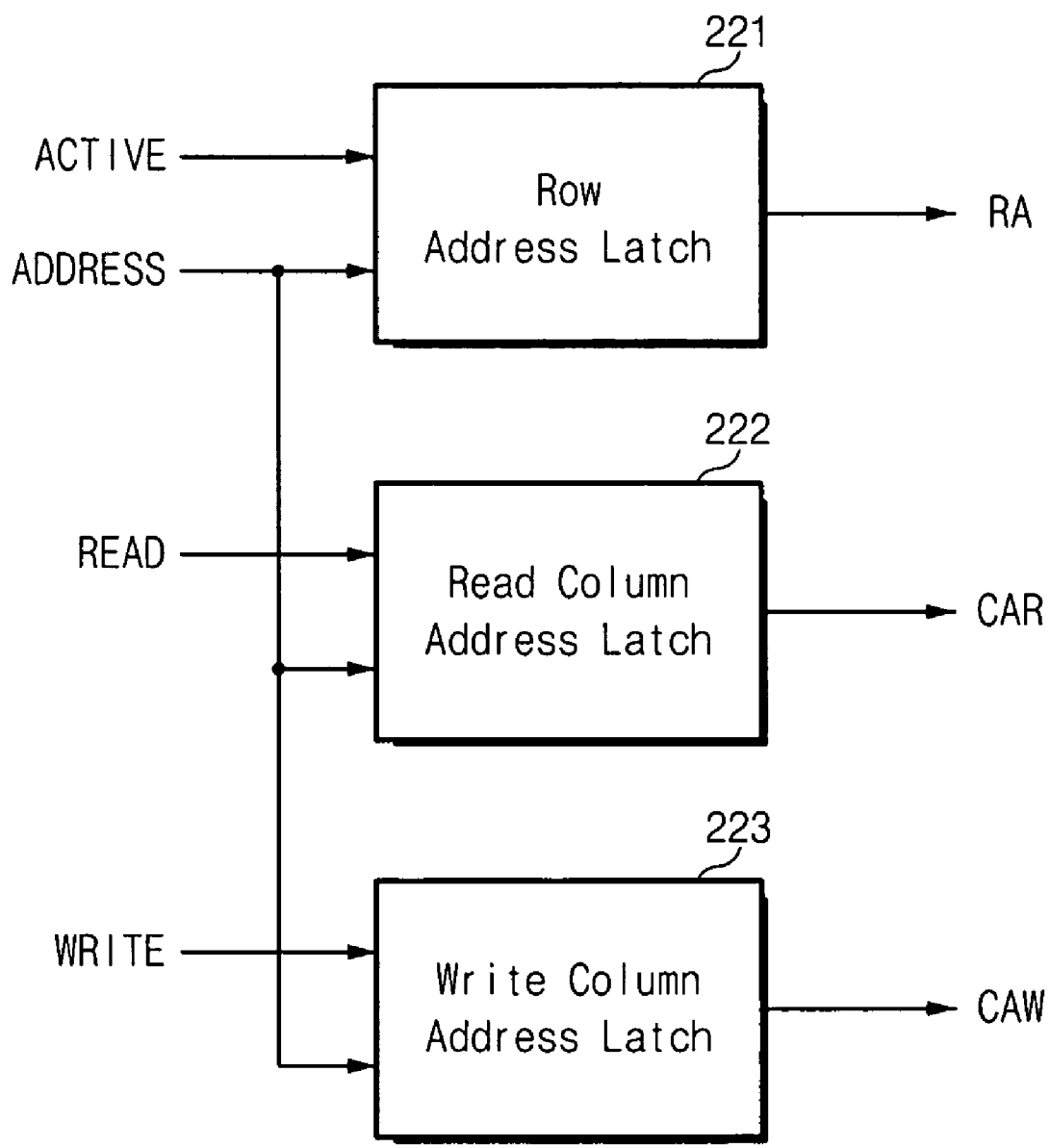
FIG. 4 is an exemplary diagram showing the configuration of an address buffer shown in FIG. 2.

An exemplary configuration of the address buffer 220 is shown in FIG. 4. Referring to FIG. 4, the address buffer includes a row address latch 221, a read column address latch 222, and a write column address latch 223.

The row address latch 221 stores an address signal and updates this address in response to an active command signal ACTIVE. The read column address latch 222 stores an address and updates this address in response to a read command signal READ. The write column address latch 223 stores an address and updates this address in response to a write command signal WRITE.

Figure 5:
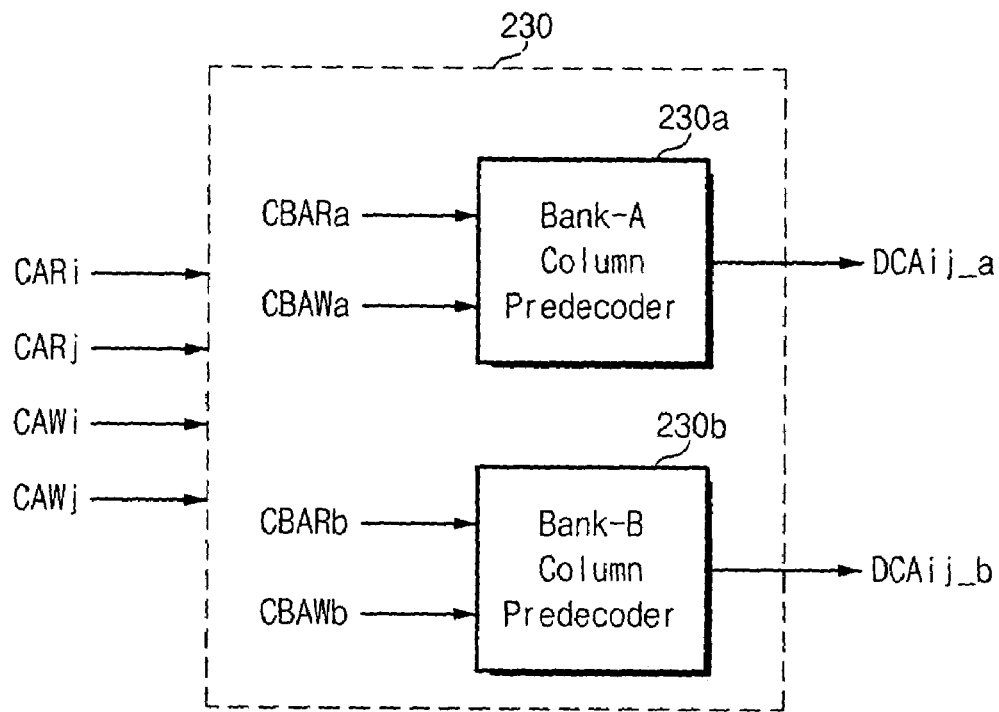
FIG. 5 is an exemplary diagram showing the configuration of a column predecoder shown in FIG. 2.
Figure 6:
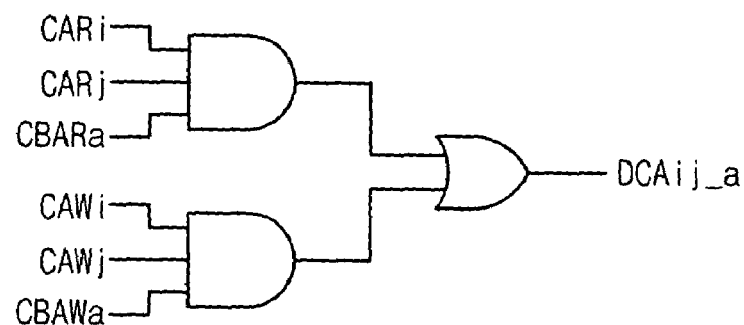
FIG. 6 is an exemplary diagram showing the logic of a column predecoder shown in FIG. 5.

An exemplary configuration of the column predecoder 230 is shown in FIG. 5, and exemplary logic of a bank-A column predecoder in the column predecoder 230 is shown in FIG. 6.

Referring to FIG. 5, the column predecoder 230 includes a bank-A column predecoder 230a incorporated in a bank A and a bank-B column predecoder 230b incorporated in a bank B.

Each of the column predecoders 230a and 230b receives read column address signals CARi and CARj and write column address signals CAWi and CAWj that are outputs of the address buffer 220 and one of read column bank address signals CBARa and CABRb and one of write column bank address signals CBAWa and CBAWb that are outputs of the bank address buffer 20 to output column address predecoding signals DCAij_a and DCAij_b.

That is, a column predecoder 230a, 230b outputs a column predecoding signal generated by summing an AND logic signal generated in response to a read column address signal and a read column bank address signal and an AND logic signal generated in response to a write column address signal and a write column bank address signal. Exemplary logic is shown in FIG. 6.

Figure 7:
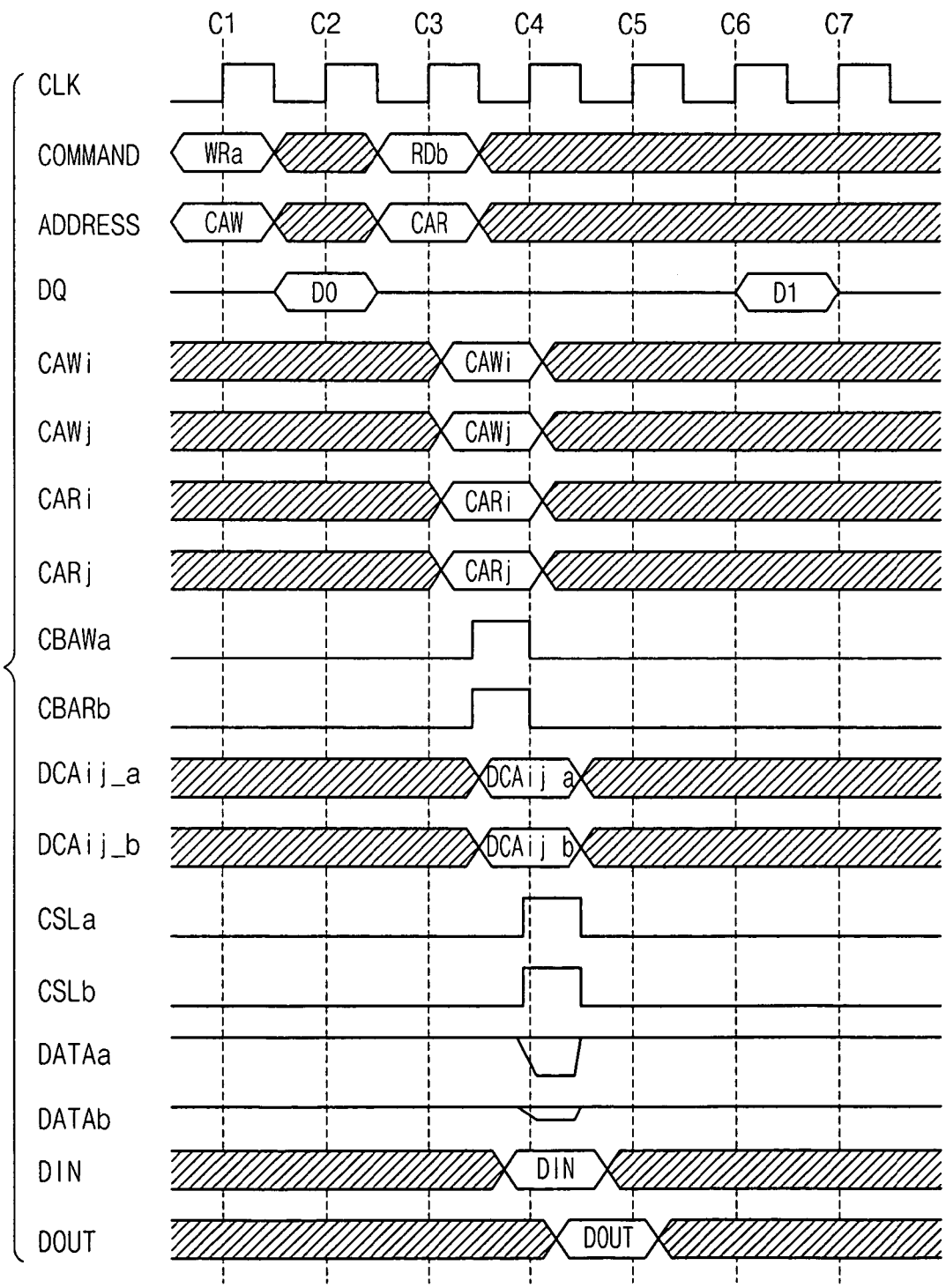
FIG. 7 is a timing diagram when a read command of one bank is applied after applying a write command of another bank in the semiconductor memory device according to an exemplary embodiment of the present invention.

FIG. 7 is an exemplary timing diagram when a read command of a bank is applied after applying a write command of another bank in the semiconductor memory device according to exemplary embodiments of the present invention. In order to illustrate the ability of exemplary embodiments of the present invention to activate a CSL for internal write and a CSL for internal read in the same clock cycle, FIG. 7 shows an exemplary case where a write command leads a read command by two clock cycles. However, in other exemplary embodiments of the present invention, a read command of another bank may be applied in the next clock after applying a write command.

In FIG. 7, a write column address is applied together with a write command and data to begin its write execution in the next clock cycle is inputted. Stored column address signals CAWi and CAWj are internally generated, which are used in the second clock cycle after a write command. These address signals are generated by holding an address given in a clock where a write command is applied and internally delaying two clocks. Since the read command of another bank is applied in the second clock after the write operation, an address inputted in this clock cycle is held to generate internal column address signals CARi and CARj for the execution of the read command. That is, a write column address signal of a bank A and a read column address signal of a bank B are generated during the same clock period. Further, a bank-B write bank address signal is activated and a bank-B read bank address signal is activated during the same clock period.

The write column address signal and the write bank address signal of the bank A are combined to generate column address predecoding signals DCAij_a of the bank A. The column address signal for reading and the column banks address signals for reading of the bank B are combined to generate column address predecoding signals DCAij_b of the bank B. A column selection signal CSLa of the bank A and a column selection signal CSLb of the bank B are generated in response to the column address predecoding signals DCAij_a and DCAij_b of the respective banks.

In response to the column selection signal CSLb of the bank B, data of a bitline sense amplifier B/L S/A is loaded on a data line DATAb for the bank B. A signal transmitted to the data line DATAb may be loaded on RP by a switch. RP may be a data bus for reading. Data lines DATAa and DATAb existing in the respective banks may be controlled by column bank address signals CBARa and CBARb for reading to be connected to RP. That is, the data lines DATAa and DATAb exist in the respective banks and may be connected to RP through a switch.

An output signal DOUT of a data sense amplifier is outputted at a suitable clock (in this embodiment, a third clock if CL=3) by a latency control signal controlled by a preset CAS latency (CL) to output read data to an input/output pin (DQ Pin) through a data output buffer 120. Externally input data may be transmitted to the data lines DATAa and DATAb of the respective banks through a write data path WP. The data line of the respective banks may be connected to the WP through write drives 150a and 150b. A write driver activated in response to a write column bank address signal may operate to write the transmitted data into bitline sense amplifiers 320a and 320b and memory cell array 310a and 310b.

As explained above, column address latch and column bank latch for read/write may be separately included in a semiconductor memory device according to exemplary embodiments of the present invention. Therefore, CLS of different banks are activated at the same time, and a data path following a data line may be divided into read/write paths to write/read data in different banks at the same time. Thus, it is possible to reduce an interval between commands generated while reading another bank after a write operation and increase bus efficiency.

While this invention has been particularly shown and described with reference to exemplary embodiments thereof, it will be understood by those skilled in the art that various changes in form and details may be made therein without departing from the spirit and scope of the invention as defined by the appended claims.

What is claimed is:

1. A semiconductor memory device comprising:
    a bank address buffer for holding a bank address;
    an address buffer separated from the bank address buffer for holding a column address and a row address;
    a memory cell array having a plurality of banks to store data; and
    a decoder incorporated in the plurality of banks to decode an address using an output of both the bank address buffer and the address buffer, the decoder generating a column decoding signal generated by summing an AND logic signal generated in response to a read column address signal and a read column bank address signal and an AND logic signal generated in response to a write column address signal and a write column bank address signal.

2. The semiconductor memory device of claim 1, wherein the bank address buffer comprises:
    a read column bank address latch for holding an address of a bank where stored data is outputted, among the banks of the memory cell array; and
    a write column bank address latch for holding an address of a bank in which externally inputted data is to be stored, among the banks of the memory cell array,
    wherein the number of the read column bank address latch and the write column bank address latches are identical to the number of the banks, respectively; and
    wherein the read column bank address latch holds a bank address input in response to a read command signal, and the write column bank address latch holds a bank address input in response to a write command.

3. The semiconductor memory device of claim 2 further comprising an input data path including:
    a write driver incorporated in respective banks; and
    an input buffer for holding data inputted through an input/output pin.

4. The semiconductor memory device of claim 3, wherein a write bank address signal held to the write column bank address latch is inputted, together with the data inputted through the input/output pin, to the write driver.

5. The semiconductor memory device of claim 2 further comprising an output data path including:
    a switch incorporated in respective banks;
    a data sense amplifier for amplifying data outputted from the bank; and
    an output buffer for holding a data signal amplified in the data sense amplifier.

6. The semiconductor memory device of claim 5, wherein a read bank address signal held to the read column bank address latch is inputted, together with data outputted from the bank, to the switch.

7. The semiconductor memory device of claim 2, wherein:
    the read column bank address latch receives a read signal and a bank address signal and updates the bank address signal based on the read signal; and
    the write column bank address latch receives a write signal and the bank address signal and updates the bank address signal based on the write signal.

8. The semiconductor memory device of claim 1, wherein the address buffer comprises:
    a row address latch for holding a row address;
    a read column address latch for outputting data; and
    a write column address latch for storing data,
    wherein the row address latch holds an address signal in response to an active command signal, the read column address latch holds an address input in response to a read command signal, and the write column address latch holds an address input in response to a write command signal.

9. The semiconductor memory device of claim 8, wherein:
    the row address latch receives an active signal and an address signal and updates the address signal based on the active signal;
    the read column address latch receives a read signal and the address signal and updates the address signal based on the read signal; and
    the write column address latch receives a write signal and the address signal and updates the bank address signal based on the write signal.

10. The semiconductor memory device of claim 1, wherein the decoder comprises a row decoder and a column decoder whereby the column decoder generates the column decoding signal.

11. The semiconductor memory device of claim 1, wherein the decoder comprises a row decoder and a column decoder having a column predecoder and a column main decoder, whereby the column decoder generates the column decoding signal.

12. The semiconductor memory device of claim 1, wherein the decoder receives an output of the bank address buffer and an output of the address buffer as inputs.

13. The semiconductor device of claim 1 further comprising:
    an output data path for outputting the data stored in the memory cell array to an input/output pin through an output buffer; and
    an input data path separated from the output data path to input data of an input buffer, externally inputted through the input/output pin, to the memory cell array.

* * * * *